(12) United States Patent
Chen et al.

(10) Patent No.: US 9,343,493 B1
(45) Date of Patent: May 17, 2016

(54) IMAGE SENSOR

(71) Applicant: UNITED MICROELECTRONICS CORPORATION, Hsinchu (TW)

(72) Inventors: Yen-Chuan Chen, New Taipei (TW); Tien-SHang Kuo, Taoyuan County (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/612,306

(22) Filed: Feb. 3, 2015

(51) Int. Cl.
*H01L 31/062* (2012.01)
*H01L 31/113* (2006.01)
*H01L 27/146* (2006.01)

(52) U.S. Cl.
CPC .... *H01L 27/14627* (2013.01); *H01L 27/14621* (2013.01)

(58) Field of Classification Search
CPC ............ H01L 21/8238; H01L 27/0922; H01L 27/1463; H01L 27/14667; H01L 27/14627; H01L 27/146; H01L 27/14621; H01L 41/1132
USPC ......... 257/292, 294, 233, 234, 288, 257, 258, 257/417, 434, E21.023, E21.027, E21.053, 257/E21.352, E21.366, E21.632
See application file for complete search history.

(56) References Cited

U.S. PATENT DOCUMENTS

| | | | | |
|---|---|---|---|---|
| 5,990,506 A * | 11/1999 | Fossum | ................ | G11C 19/282 250/206 |
| 6,232,590 B1 * | 5/2001 | Baek | ................. | H01L 27/14627 250/208.1 |
| 6,369,417 B1 * | 4/2002 | Lee | ................... | H01L 27/14609 257/294 |
| 6,617,189 B1 * | 9/2003 | Chen | ................ | H01L 27/14621 438/48 |
| 7,250,591 B2 * | 7/2007 | Mouli | ...................... | G02B 5/20 250/208.1 |
| 7,632,700 B2 * | 12/2009 | Mouli | ...................... | G02B 5/20 438/70 |
| 7,695,995 B2 * | 4/2010 | Hwang | ............... | H01L 27/1462 438/57 |

* cited by examiner

*Primary Examiner* — David Nhu
(74) *Attorney, Agent, or Firm* — Ding Yu Tan

(57) ABSTRACT

An image sensor is provided. The image sensor includes a semiconductor substrate having a sensing region and a non-sensing region; a passivation layer formed on the semiconductor substrate; a first planar layer formed on the passivation layer; a color filter layer formed on the first planar layer with respect to the sensing region and a shielding layer formed on the first planar layer with respect to the non-sensing region; a plurality of micro-lens layers formed on the color filter layer and on the shielding layer; and a plurality of cap oxide layers formed on the micro-lens layer.

17 Claims, 4 Drawing Sheets

IMAGE SENSOR

FIELD OF THE INVENTION

The present invention generally relates to an image sensor and, more particularly, to an image sensor capable of preventing a cap oxide layer thereof from cracking or peeling off, thereby improving the reliability and lengthening the lifetime of the image sensor.

BACKGROUND OF THE INVENTION

An image sensor is generally a semiconductor device generating image data by sensing a light beam reflected from an object. Such an image sensor includes a micro-lens array that guides the incident light beam toward a photodiode to generate photoelectric charges corresponding to the amount of the incident light beam received.

With reference to FIG. 1, which illustrates a schematic cross-sectional partial view of an exemplary complementary metal oxide semiconductor (CMOS) image sensor taught in prior art. The illustrated CMOS image sensor 10 includes a semiconductor structure, which has: a substrate 101 with the property of photodiode; a light receiving surface 102 on the substrate 101; a dielectric layer 103 having a metal wiring layer 104 therein and being above the light receiving surface 102; a color filter layer 105 on the dielectric layer 103; a micro-lens layer 106 on the color filter layer 105; and a cap oxide layer 107 on the micro-lens layer 106. As shown in FIG. 1, the use of the cap oxide layer 107 is to improve sensitivity of the CMOS image sensor 10 because it provides a larger light collecting surface. For instance, an incident light beam L1 is through the cap oxide layer 107, the micro-lens layer 106, the color filter layer 105, and the dielectric layer 103, but is blocked by the metal wiring layer 104; the incident light beam L1 is continuously reflected by the metal wiring layer 104 in order to become an eject light beam L2; further, another pair of an incident light beam L6 and an eject light beam L7 is the same in behavior and properties as the pair of the incident light beam L1 and the eject light beam L2. Another incident light beam L3 can be directly transmitted through the cap oxide layer 107, the micro-lens layer 106, the color filter layer 105, the gaps between the metal wiring layer 104, the dielectric layer 103, and the light receiving surface 102 to the substrate 101; further, other two incident light beams L4 and L5 are the same as the incident light beam L3. As it can be seen, the convex curvature and thickness of the cap oxide layer 107 increase the light collecting surface, so that the cap oxide layer 107 is capable of collecting more light beams. Accordingly, the cap oxide layer 107 may be easily cracked or peeled off due to unstable stress occurring at the interface between the cap oxide layer 107 and the micro-lens layer 106.

Therefore, there is a need in providing an image sensor capable of preventing a cap oxide layer thereof from cracking or peeling off, thereby improving the reliability and lengthening the lifetime of the image sensor.

SUMMARY OF THE INVENTION

It is one object of the present invention to provide an image sensor capable of preventing a cap oxide layer thereof from cracking or peeling off, thereby improving the reliability and lengthening the lifetime of the image sensor.

It is one object of the present invention to provide an image sensor capable of avoiding crosstalk, thereby enhancing the signal-to-noise ratio of the image sensor.

In order to achieve the foregoing objects, in one embodiment, the present invention provides an image sensor. The image sensor includes a semiconductor substrate comprising a sensing region and a non-sensing region; a passivation layer formed on the semiconductor substrate; a first planar layer formed on the passivation layer; a color filter layer formed on the first planar layer with respect to the sensing region and a shielding layer formed on the first planar layer with respect to the non-sensing region; a plurality of micro-lens layers formed on the color filter layer and on the shielding layer; and a plurality of cap oxide layers formed on the micro-lens layer.

In another embodiment, the present invention provides an image sensor. The image sensor includes a semiconductor substrate comprising a sensing region and a non-sensing region; a passivation layer formed on the semiconductor substrate; a first planar layer formed on the passivation layer; a color filter layer formed on the first planar layer with respect to the sensing region and a shielding layer formed on the first planar layer with respect to the non-sensing region; a plurality of micro-lens layers comprising a plurality of first micro-lenses formed on the color filter layer and a plurality of second micro-lenses formed on the shielding layer; and a plurality of cap oxide layers formed on the plurality of first micro-lenses and on the plurality of second micro-lenses.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of the embodiments of this invention are presented herein for purpose of illustration and description only. It is not intended to be exhaustive or to be limited to the precise form disclosed.

Figure 1:
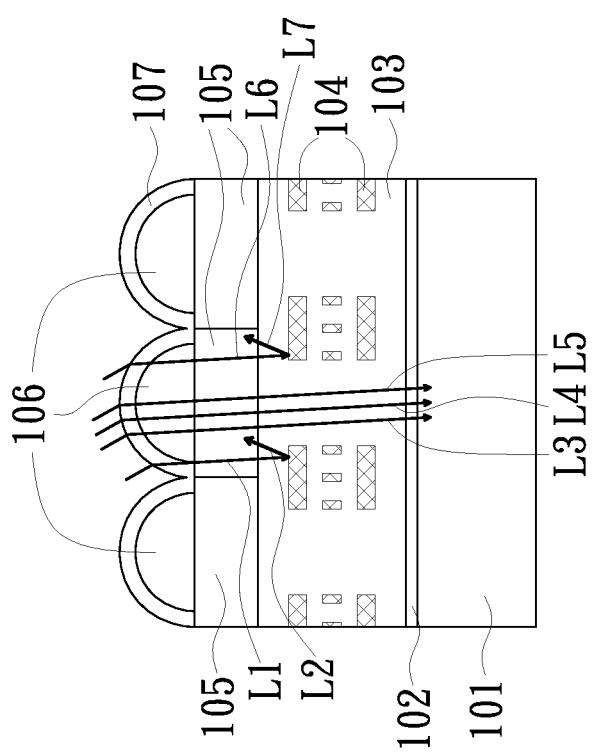
FIG. 1 illustrates a schematic cross-sectional partial view of an exemplary complementary metal oxide semiconductor (CMOS) image sensor taught in prior art.
Figure 2:
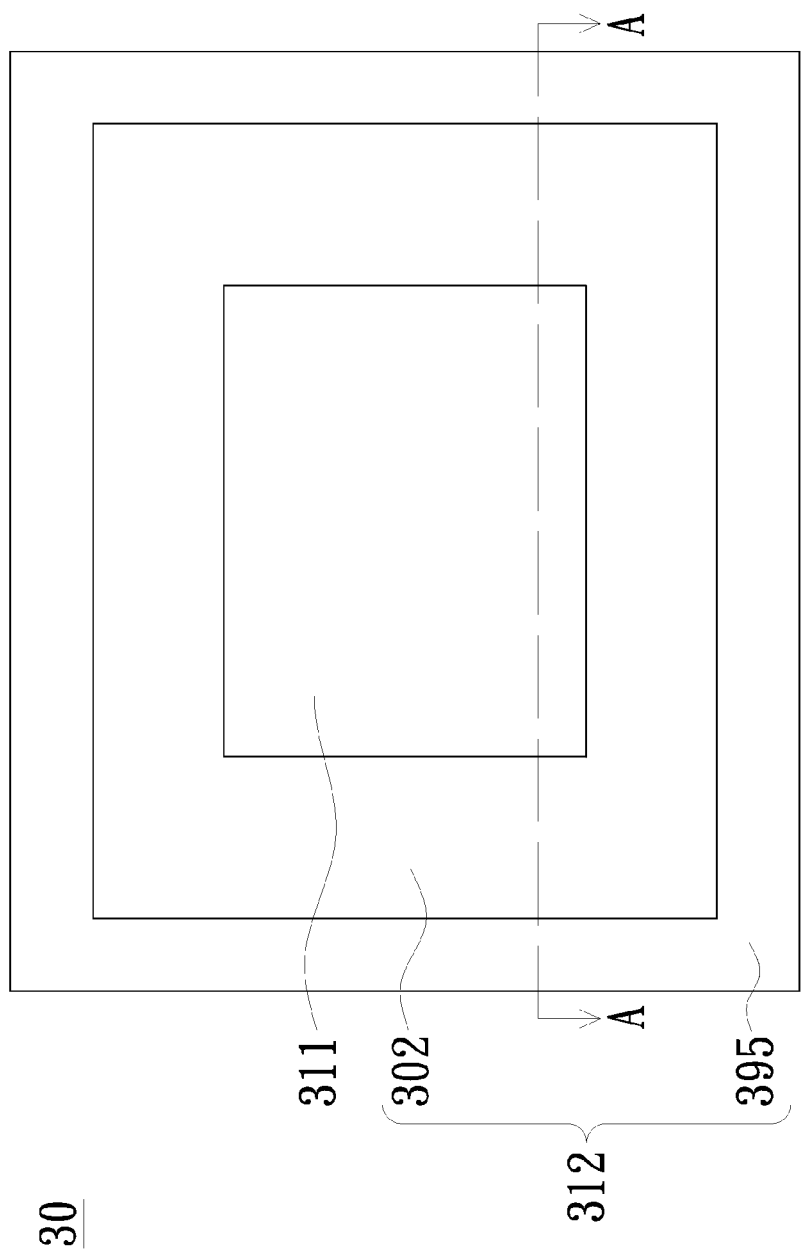
FIG. 2 is a top view illustrating an image sensor according to a first preferred embodiment of the present invention.

Please refer to FIG. 2 for a top view illustrating an image sensor 30 according to a first preferred embodiment of the present invention. As shown in FIG. 2, the image sensor 30 is divided into a sensing region 311, a periphery region 302 and a pad open region 395; wherein the periphery region 302 and the pad open region 395 forms a non-sensing region 312. FIG. 2 only illustrates a layout that defines relationships among the sensing region 311, the periphery region 302 and the pad open region 395, but other factors as areas, processes, etc. are not limited thereto.

Figure 3:
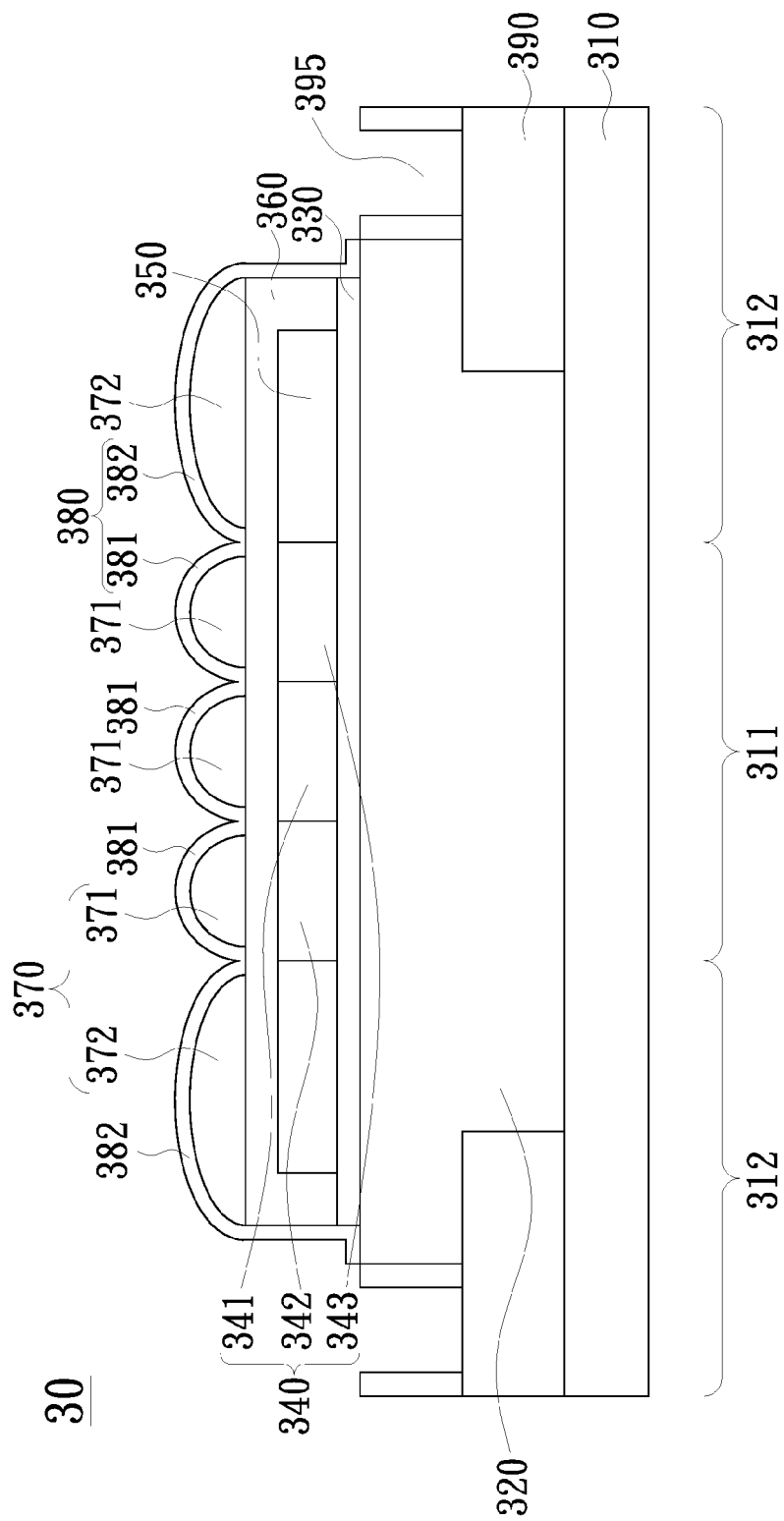
FIG. 3 is a cross-sectional view taken along line A-A in FIG. 2 to illustrate the image sensor according to the first preferred embodiment of the present invention.

With reference to FIG. 3, a cross-sectional view is taken along line A-A in FIG. 2 to further illustrate the image sensor 30 according to the first preferred embodiment of the present invention. In FIG. 3, the image sensor 30 includes: a semiconductor substrate 310 comprising the sensing region 311 and the non-sensing region 312; a passivation layer 320 formed on the semiconductor substrate 310; a first planar layer 330 formed on the passivation layer 320; a color filter layer 340 formed on the first planar layer 330 with respect to the sensing region 311 and a shielding layer 350 formed on the first planar layer 330 with respect to the non-sensing region 312, wherein the shielding layer 350 can be a red shielding layer, a blue shielding layer or a green shielding layer, but the blue shielding layer is preferred; a plurality of micro-lens layers 370 formed on the color filter layer 340 and the shielding layer 350; and a plurality of cap oxide layers 380 formed on the micro-lens layers 370.

In the present embodiment, the color filter layer 340 comprises a plurality of sub-pixel areas for red (R) sub-pixels 341, green (G) sub-pixels 342 and blue (B) sub-pixels 343 to capture color information. The color filter layer 340 is needed because the typical image sensors detect light intensity with little or no wavelength specificity, and therefore cannot separate color information. The color filter layer 340 filters the light by the wavelength range, such that the separate filtered intensities include information about the color of light. Further, FIG. 3 only illustrates one set of color filter layer 340 including one red sub-pixel area 341 for red sub-pixel, one green sub-pixel area 342 for green sub-pixel and one blue sub-pixel area 343 for blue sub-pixel area. As a matter of fact, there are a plurality of sets of color filter layers 340, and each set of color filter layer 340 has the plurality of red sub-pixel areas 341 for red sub-pixels, the plurality of green sub-pixel areas 342 for green sub-pixels and the plurality of blue sub-pixel areas 343 for blue sub-pixels.

In the present embodiment, each of the micro-lens layers 370 comprises photoresist, and can thus be divided by photolithography into a first micro-lens 371 on the color filter layer 340 and a second micro-lens 372 on the shielding layer 350. The first micro-lens 371 corresponds to one of the plurality of red, green, blue sub-pixel areas 341, 342 and 343. In the present embodiment, as shown in FIG. 3, the second micro-lens 372 has a size larger than the first micro-lens 371, and each of the plurality of red (R) sub-pixel areas 341, green (G) sub-pixel areas 342 and blue (B) sub-pixel areas 343. In other words, the curvature of the second micro-lenses 372 is smaller than the curvature of the first micro-lenses 371. Similarly, the cap oxide layers 380 formed on the micro-lens layers 370 include a plurality of first caps 381 covering the first micro-lenses 371, respectively, and a plurality of second caps 382 covering the second micro-lenses 372, respectively. The use of the cap oxide layers 380 is to improve sensitivity of the image sensor 30 because each of the cap oxide layers 380 provides a larger light collecting surface. In the present embodiment, the cap oxide layer 380 is prevented from cracking or peeling off because the unstable stress at the interface between the second caps 382 and the second micro-lenses 372 is reduced.

Since the first micro-lenses 371 and the second micro-lenses 372 serve as convex lenses that can focus light, undesired crosstalk can be avoided, thereby enhancing the signal-to-noise ratio of the image sensor 30.

In the present embodiment, the image sensor 30 may further include a second planar layer 360 formed on the color filter layer 340 and the shielding layer 350 prior to the formation of the micro-lens layers 370. In addition, both the first planar layer 330 and the second planar layer 360 comprise photoresist.

With reference to FIG. 2 and FIG. 3, the non-sensing region 312 in FIG. 3 corresponds to the periphery region 302 and the pad open region 395 in FIG. 2. In the non-sensing region 312, the pad open region 395 is provided on a last-metal layer 390 for electrical connection to the photodiodes and transistors (not shown) in the substrate 310.

Figure 4:
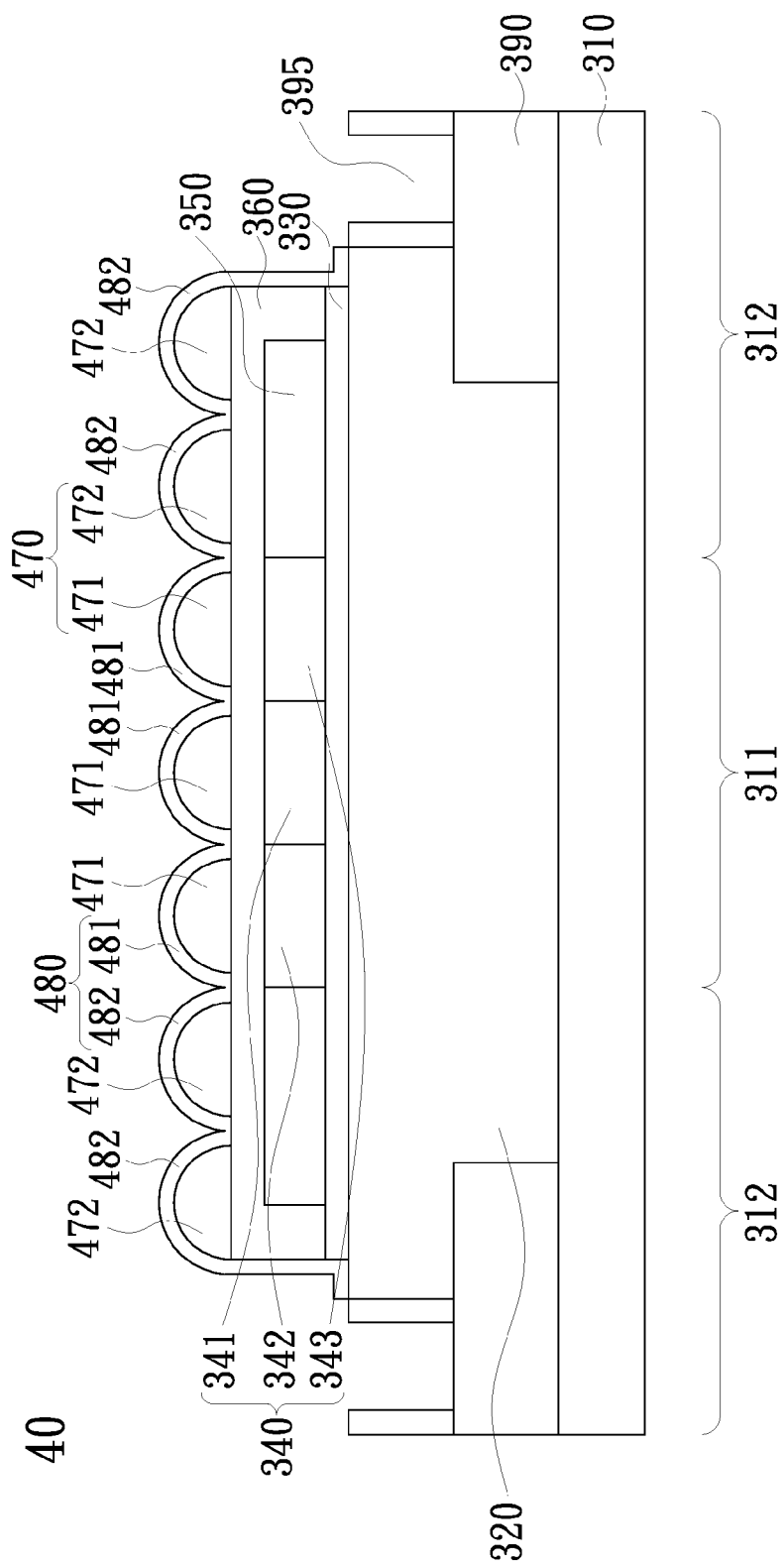
FIG. 4 is a cross-sectional view taken along line A-A in FIG. 2 to illustrate an image sensor according to a second preferred embodiment of the present invention.

With reference to FIG. 4, a cross-sectional view is taken along line A-A in FIG. 2 to further illustrate an image sensor according to a second preferred embodiment of the present invention. In FIG. 4, the image sensor 40 includes: the semiconductor substrate 310 comprising the sensing region 311 and the non-sensing region 312; the passivation layer 320 formed on the semiconductor substrate 310; the first planar layer 330 formed on the passivation layer 320; the color filter layer 340 formed on the first planar layer 330 with respect to the sensing region 311 and the shielding layer 350 formed on the first planar layer 330 with respect to the non-sensing region 312, wherein the shielding layer 350 can be a red shielding layer, a blue shielding layer or a green shielding layer, but the blue shielding layer is preferred; a plurality of micro-lens layers 470 formed on the color filter layer 340 and on the shielding layer 350; and a plurality of cap oxide layers 480 formed on the micro-lens layers 470, respectively.

It should be noted that the image sensor 40 in FIG. 4 is similar to the image sensor 30 in FIG. 3 except for the micro-lens layer 470 and the cap oxide layer 480 in contrast with the micro-lens layers 370 and the cap oxide layer 380, respectively. The other components of the image sensor 40 in FIG. 4 are identical to their equivalents of the image sensor 30 in FIG. 3. Accordingly, identical numbers are used and descriptions of these components are not redundantly repeated. Further, FIG. 4 only illustrates one set of color filter layer 340 including one red sub-pixel area 341 for red sub-pixel, one green sub-pixel area 342 for green sub-pixel and one blue sub-pixel area 343 for blue sub-pixel. As a matter of fact, there are a plurality of sets of color filter layers 340, and each set of color filter layer 340 has a plurality of red sub-pixel areas 341 for red sub-pixels, a plurality of green sub-pixel areas 342 for green sub-pixels and a plurality of blue sub-pixel areas 343 for blue sub-pixels.

In the present embodiment, each of the micro-lens layer 470 comprises photoresist, and can thus be divided by photolithography into a first micro-lens 471 on the color filter layer 340 and a second micro-lens 472 on the shielding layer 350. The first micro-lenses 471 corresponds to one of the plurality of red, green, blue sub-pixel areas 341, 342 and 343. In the present embodiment, as shown in FIG. 4, each of the second micro-lenses 472 has the same size as each of the plurality of first micro-lenses 471 and each of the plurality of sub-pixel areas 341, 342, 343. In other words, the curvature of the second micro-lenses 472 is equal to the curvature of the second micro-lenses 471. Similarly, the cap oxide layers 480 formed on the micro-lens layers 470 include a plurality of first caps 481 covering the first micro-lenses 471 and a plurality of second caps 482 covering the second micro-lenses 472. The use of the cap oxide layers 480 is to improve sensitivity of the image sensor 40 because each of the cap oxide layers 480 provides a larger light collecting surface. In the present embodiment, the cap oxide layer 480 is prevented from cracking or peeling off because the unstable stress at the interface between the second caps 482 and the second micro-lenses 472 is reduced.

Since the first micro-lenses 471 and the second micro-lenses 472 serve as convex lenses that can focus light, undesired crosstalk can be avoided, thereby enhancing the signal-to-noise ratio of the image sensor 40.

With of realization of the present invention, the image sensor is capable of preventing a cap oxide layer thereof from cracking or peeling, thereby improving the reliability and lengthening the lifetime of the image sensor. Moreover, the image sensor is capable of avoiding crosstalk, thereby enhancing the signal-to-noise ratio of the image sensor.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An image sensor, comprising:
   a semiconductor substrate (310) comprising a sensing region (311) and a non-sensing region (312);
   a passivation layer (320) formed on said semiconductor substrate (310);
   a first planar layer (330) formed on said passivation layer (320);
   a color filter layer (340) formed on said first planar layer (330) with respect to said sensing region (311) and a shielding layer (350) formed on said first planar layer (330) with respect to said non-sensing region (312);
   a second planar layer (360) formed on said color filter layer (340) and on said shielding layer (350);
   a plurality of micro-lens layers (370)(470) formed on said color filter layer (340) and on said shielding layer (350); and
   a plurality of cap oxide layers (380)(480) formed on said micro-lens layers (370)(470).

2. The image sensor of claim 1, wherein said color filter layer (340) comprises a plurality of red sub-pixel areas, green sub-pixel areas, and blue sub-pixel areas (341, 342, 343).

3. The image sensor of claim 2, wherein said micro-lens layers (370)(470) comprise photoresist.

4. The image sensor of claim 3, wherein each of said micro-lens layers (370)(470) on said color filter layer (340) is divided by photolithography into a plurality of first micro-lenses (371)(471), each of said plurality of first micro-lenses (371)(471) corresponding to one of said plurality of sub-pixel areas (341, 342, 343).

5. The image sensor of claim 3, wherein each of said micro-lens layers (370)(470) on said shielding layer (350) is divided by photolithography into a plurality of second micro-lenses (372)(472), each of said plurality of second micro-lenses (372)(472) has a size larger than or equal to each of said plurality of sub-pixel areas (341, 342, 343).

6. The image sensor of claim 1, wherein said first planar layer (330) comprises photoresist.

7. The image sensor of claim 1, wherein said second planar layer (360) comprises photoresist.

8. An image sensor, comprising:
   a semiconductor substrate (310) comprising a sensing region (311) and a non-sensing region (312);
   a passivation layer (320) formed on said semiconductor substrate (310);
   a first planar layer (330) formed on said passivation layer (320);
   a color filter layer (340) formed on said first planar layer (330) with respect to said sensing region (311) and a shielding layer (350) formed on said first planar layer (330) with respect to said non-sensing region (312);
   a plurality of micro-lens layers (370)(470) comprising a plurality of first micro-lenses (371)(471) formed on said color filter layer (340) and a plurality of second micro-lenses (372)(472) formed on said shielding layer (350); and
   a plurality of cap oxide layers (380)(480) formed on said plurality of first micro-lenses (371)(471) and on said plurality of second micro-lenses (372)(472).

9. The image sensor of claim 8, wherein said color filter layer (340) comprises a plurality of red sub-pixel areas, green sub-pixel areas, and blue sub-pixel areas (341, 342, 343).

10. The image sensor of claim 9, wherein each of said plurality of first micro-lenses (371)(471) corresponds to one of said plurality of sub-pixel areas (341, 342, 343).

11. The image sensor of claim 10, wherein each of said plurality of first micro-lenses (371)(471) and each of said plurality of second micro-lenses (372)(472) have the same size.

12. The image sensor of claim 10, wherein each of said plurality of first micro-lenses (371)(471) and each of said plurality of second micro-lenses (372)(472) have different sizes.

13. The image sensor of claim 10, wherein each of said plurality of first micro-lenses (371)(471) and each of said plurality of second micro-lenses (372)(472) have the same curvature.

14. The image sensor of claim 10, wherein each of said plurality of first micro-lenses (371)(471) and each of said plurality of second micro-lenses (372)(472) have different curvatures.

15. The image sensor of claim 8, wherein said first planar layer (330) comprises photoresist.

16. The image sensor of claim 8, further comprising a second planar layer (360) formed on said color filter layer (340) and on said shielding layer (350) prior to the formation of said micro-lens layer (370)(470).

17. The image sensor of claim 16, wherein said second planar layer (360) comprises photoresist.

* * * * *